United States Patent
Ishido

(10) Patent No.: US 9,614,362 B2
(45) Date of Patent: Apr. 4, 2017

(54) OVERCURRENT PROTECTION DEVICE

(71) Applicant: KYOCERA Document Solutions Inc., Osaka (JP)

(72) Inventor: Kohei Ishido, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 140 days.

(21) Appl. No.: 14/556,004

(22) Filed: Nov. 28, 2014

(65) Prior Publication Data

US 2015/0146335 A1 May 28, 2015

(30) Foreign Application Priority Data

Nov. 28, 2013 (JP) .................................. 2013-246307

(51) Int. Cl.
*H02H 3/08* (2006.01)
*H05K 1/02* (2006.01)

(52) U.S. Cl.
CPC ........... *H02H 3/085* (2013.01); *H05K 1/0265* (2013.01); *H05K 1/0212* (2013.01); *H05K 2201/09727* (2013.01); *H05K 2201/10151* (2013.01)

(58) Field of Classification Search
CPC .... H02H 3/085; H05K 1/0265; H05K 1/0212; H05K 2201/09727; H05K 2201/10151
USPC ....................................................... 361/93.8
See application file for complete search history.

(56) References Cited

U.S. PATENT DOCUMENTS

| | | | | |
|---|---|---|---|---|
| 5,235,139 A | * | 8/1993 | Bengston | H05K 3/244 174/257 |
| 6,321,175 B1 | * | 11/2001 | Nagaraj | G01K 7/42 257/467 |
| 6,787,896 B1 | * | 9/2004 | Petty-Weeks | H01L 23/3677 257/700 |

(Continued)

FOREIGN PATENT DOCUMENTS

| | | |
|---|---|---|
| JP | H04-344120 A | 11/1992 |
| JP | H07-044039 A | 2/1995 |

(Continued)

*Primary Examiner* — Scott Bauer
(74) *Attorney, Agent, or Firm* — Hawaii Patent Services; Nathaniel K. Fedde; Kenton N. Fedde

(57) ABSTRACT

An overcurrent protection device satisfactorily detects overcurrent without adding complicated component or occupying large space. Penetration member penetrates board face A having a first wiring circuit and face B with a second one, transmitting heat from face A to B. Connection/disconnection part is inserted into first wiring circuit, switching current to heat generation part for generating heat with current, formed in portion of first circuit, continued with one end of penetration member. Temperature detection member disposed near or abutted against other end of penetration member on face B detects transmitted heat, outputting signal. Control part controls connection/disconnection part on signal. Heat generation part is narrower than width w1 not generating heat in steady state, having width w2 to raise temperature upon overcurrent, and being sandwiched between patterns with width w1. Control part turns off current with heat generation part temperature raised to or above prescribed threshold.

1 Claim, 10 Drawing Sheets

(56) References Cited

U.S. PATENT DOCUMENTS

| | | | |
|---|---|---|---|
| 8,112,884 B2* | 2/2012 | Tullidge | H05K 1/0206 |
| | | | 174/262 |
| 9,203,008 B2* | 12/2015 | Preuschl | H05K 1/0206 |
| 9,318,406 B2* | 4/2016 | Prautzsch | H01L 23/34 |
| 2001/0048708 A1* | 12/2001 | Mikubo | G01K 7/42 |
| | | | 374/43 |
| 2006/0180821 A1* | 8/2006 | Fan | F21K 9/00 |
| | | | 257/98 |

FOREIGN PATENT DOCUMENTS

| | | |
|---|---|---|
| JP | H10-026345 A | 1/1998 |
| JP | 2006-185603 A | 7/2006 |
| JP | 2009-153237 A | 7/2009 |
| JP | 2011-217463 A | 10/2011 |

\* cited by examiner

Fig. 1

| Width w2 (mm) | Current I (A) | | |
|---|---|---|---|
| | Temp. 10°C raised | Temp. 20°C raised | Temp. 45°C raised |
| 0.1 | 0.24 | 0.7 | 0.9 |
| 0.2 | 0.8 | 1.2 | 1.7 |
| 0.5 | 1.4 | 2.0 | 3.0 |
| 1.0 | 2.2 | 3.0 | 4.2 |

Ambient temperature: 25°C

Fig.3

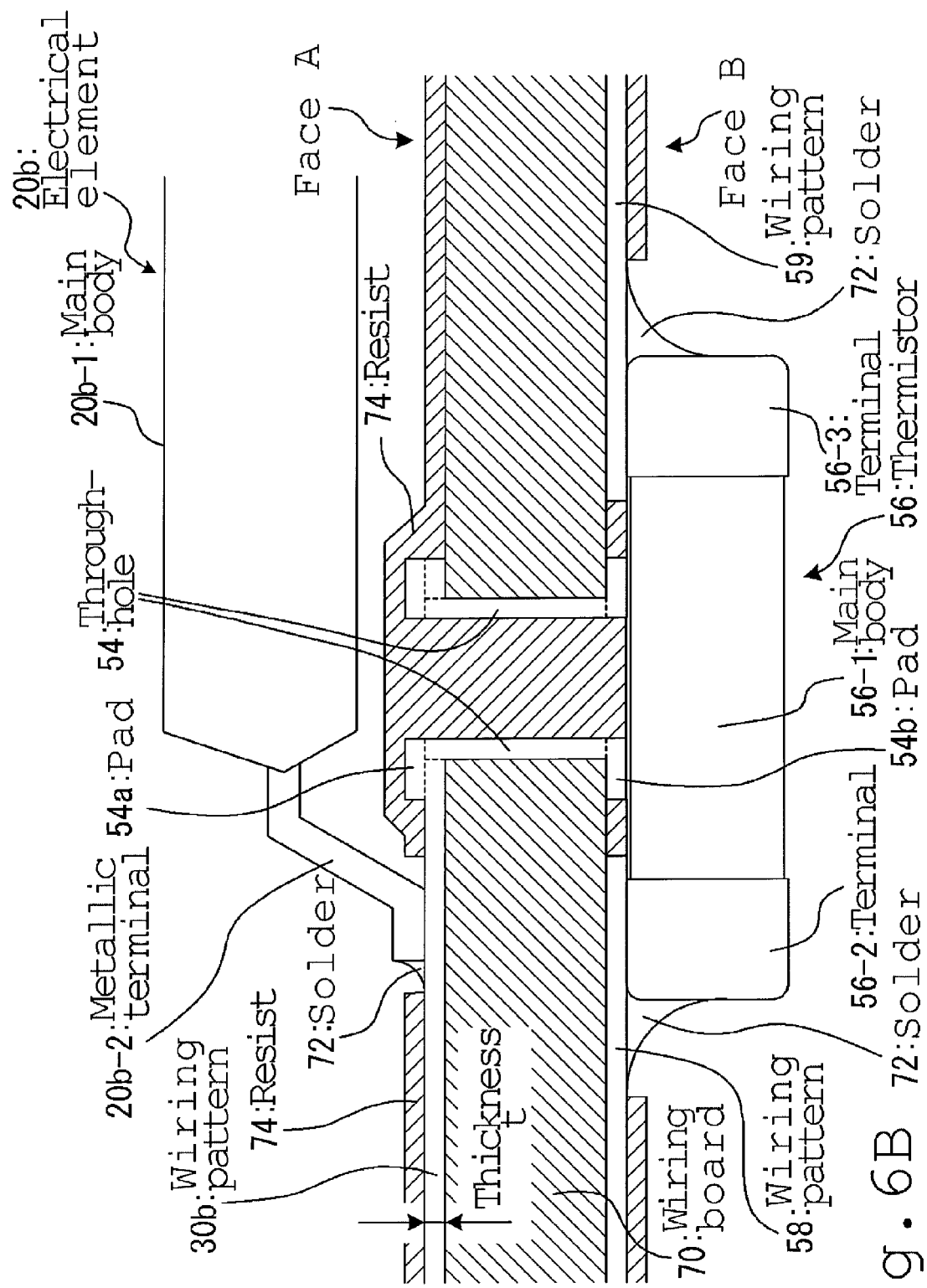

OVERCURRENT PROTECTION DEVICE

INCORPORATION BY REFERENCE

This application is based on and claims the benefit of priority from Japanese Patent Application No. 2013-246307 filed on Nov. 28, 2013, the contents of which are hereby incorporated by reference.

BACKGROUND

The present disclosure relates to a device that is capable of preventing an overcurrent from flowing into a wiring pattern or element disposed on a circuit board.

In recent years, there has been a high demand for downsizing the electronic circuit board, and in response to such demand, electronic components, and the like, have been downsized. However, the power to be handled by the electronic components, and the like, has not been extremely lowered with the downsizing thereof. Therefore, it can be the that the electronic components, and the like, have become easier to generate heat. However, some of the electronic components, and the like, cause malfunctioning, being overheated. Such malfunctioning, if caused, can have an adverse effect on the related parts, and the like, resulting in an unexpected accident. As one of the measures to prevent such an accident, there is available a method for protecting against an overcurrent to thereby suppress excessive heat from being generated.

Various methods of protecting against an overcurrent have been worked out. For example, there is available a method that monitors a voltage drop across a resistor connected in series. As another example, there is available a method that uses an element the resistance value of which is increased with an increase of the current passing therethrough, thereby an overcurrent being suppressed. However, any of the methods is faced with various problems. For example, there is presented a problem that a component for monitoring or suppressing the occurrence of an overcurrent occupies a large space. In addition, there is presented a problem that a great voltage drop is caused, or a long time is required to response to an overcurrent.

SUMMARY

The overcurrent protection device of the present disclosure includes an insulating member, a penetration member, a heat generation wiring part, a connection/disconnection part, a temperature detection member, and a control part. On a first face of the insulating member, a first wiring circuit through which a current is passed can be formed. Further, on a second face of the insulating member that is a face opposite to the first face, a second wiring circuit can be formed. The penetration member penetrates through the insulating member, thereby being capable of transmitting heat from the first face to the second face. The heat generation wiring part is formed in a portion of the first wiring circuit in continuation with one end part of the penetration member. In addition, the heat generation wiring part generates heat with the current being passed. The connection/disconnection part is inserted into the first wiring circuit to turn on or off the current. The temperature detection member is disposed in proximity of or in abutment against the other end part of the penetration member that is on the second face. The temperature detection member detects heat transmitted from the heat generation wiring part by the penetration member and outputs a temperature detection signal for the heat generation wiring part. The control part controls the connection/disconnection part on the basis of the detection signal. The heat generation wiring part has a second line width narrower than a first line width, being sandwiched between wiring patterns with the first line width. The first line width is a line width that cannot cause the temperature to be raised to or above a prescribed threshold value with the current flowing in a steady state. The second line width is a line width that can cause the temperature to be raised to or above the prescribed threshold value when the current has become an overcurrent. The control part determines that the current has become an overcurrent when the temperature of the heat generation wiring part that is detected by the temperature detection member has been raised to or above the prescribed threshold value. In this case, the control part controls the connection/disconnection part to turn off the current.

Alternatively, an overcurrent protection device of the present disclosure includes an insulating member, a penetration member, an electrical element, a connection/disconnection part, a temperature detection member, and a control part. On a first face of the insulating member, a first wiring circuit can be formed. In addition, on a second face of the insulating member that is a face opposite to the first face, a second wiring circuit can be formed. The penetration member penetrates through the insulating member, thereby being capable of transmitting heat from the first face to the second face. The electrical element generates heat with a current flowing through the first wiring circuit. The connection/disconnection part is inserted into the first wiring circuit to turn on or off the current. The temperature detection member is disposed in proximity of or in abutment against the other end part of the penetration member that is on the second face. The temperature detection member detects heat transmitted from the electrical element by the penetration member and outputs a temperature detection signal for the electrical element. The control part controls the connection/disconnection part on the basis of the detection signal. The main body of the electrical element is disposed in proximity of or in abutment against the other end part of the penetration member that is on the first face. The control part determines that the current has become an overcurrent when the temperature of the electrical element that is detected by the temperature detection member has been raised to or above the prescribed threshold value. In this case, the control part controls the connection/disconnection part to turn off the current.

Alternatively, an overcurrent protection device of the present disclosure includes an insulating member, a penetration member, an electrical element, a connection/disconnection part, a temperature detection member, and a control part. On a first face of the insulating member, a first wiring circuit can be formed. In addition, on a second face of the insulating member that is a face opposite to the first face, a second wiring circuit can be formed. The penetration member penetrates through the insulating member, thereby being capable of transmitting heat from the first face to the second face. In addition, one end part of the penetration member is connected to the first wiring circuit. With the electrical element, a metallic terminal thereof to which a current flowing through the first wiring circuit is inputted is protruded. In addition, the electrical element generates heat with the current. The connection/disconnection part is inserted into the first wiring circuit to turn on or off the current. The temperature detection member is disposed in proximity of or in abutment against the other end part of the penetration member that is on the second face. The temperature detection member detects heat transmitted from the heat generation wiring part by the penetration member and outputs a temperature detection signal for the electrical element. The control part controls the connection/disconnection part on the basis of the detection signal. The metallic terminal is fixed in the vicinity of one end part of the penetration member. The control part determines that the current has become an overcurrent when the temperature of the electrical element that is detected by the temperature detection member has been raised to or above the prescribed threshold value. In this case, the control part controls the connection/disconnection part to turn off the current.

BRIEF DESCRIPTION OF THE DRAWINGS

FIG. 1 is a block diagram illustrating a configuration of an overcurrent protection device of a first embodiment of the present disclosure that is related to an image forming apparatus;

FIG. 2C is a sectional view of the same circuit board in FIG. 2A AND FIG. 2B;

FIG. 3 is a chart illustrating one example of relationship between the current and the value of temperature rise for a particular width of the wiring pattern in the first embodiment of the present disclosure;

FIG. 6B is a sectional view of a circuit board of the same overcurrent protection device in FIG. 6A.

DETAILED DESCRIPTION

First Embodiment

Figure 2A:
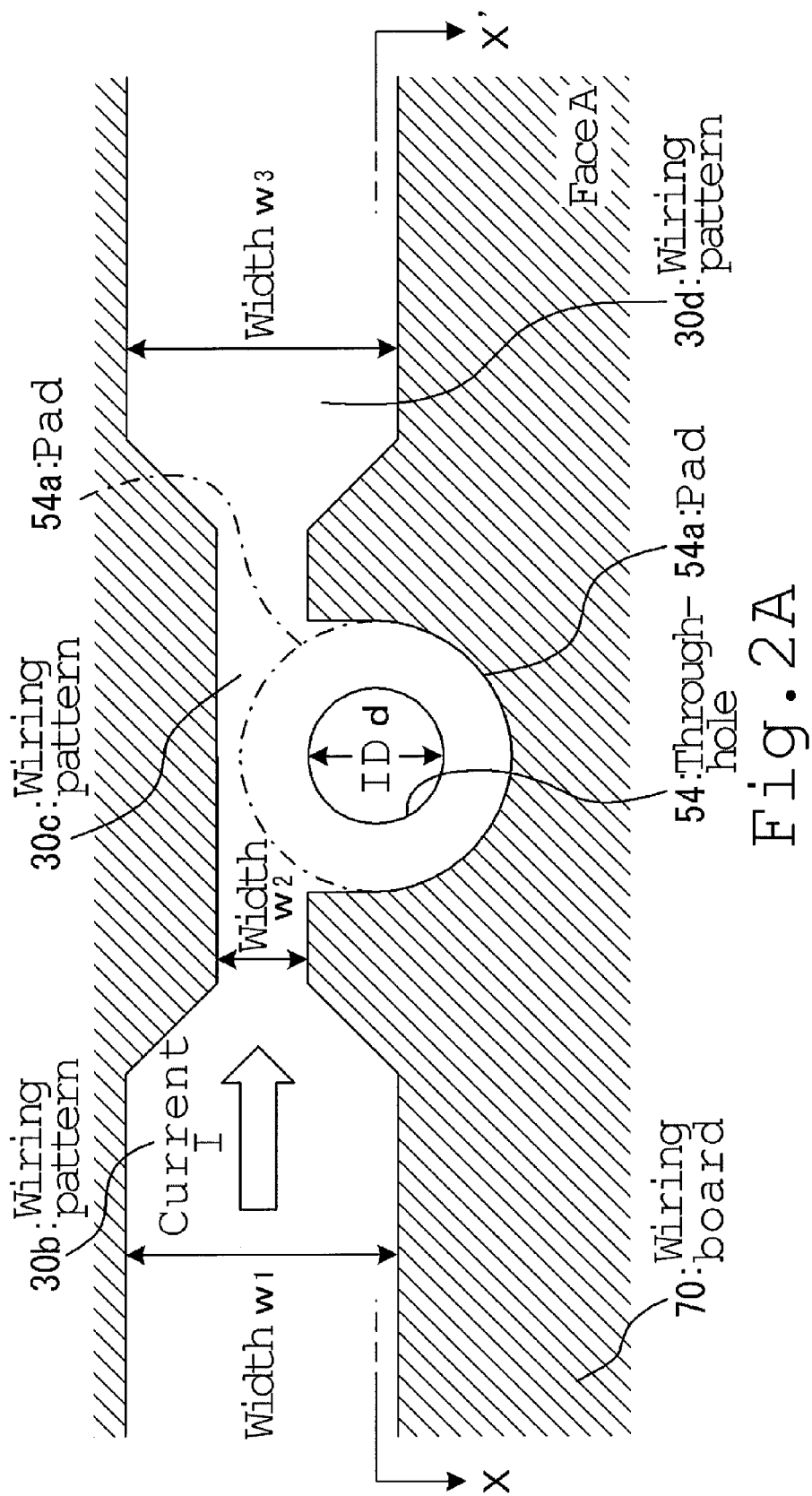
FIG. 2A is plan views of one face of a circuit board of the first embodiment of the present disclosure that is related to an image forming apparatus.

Next, a first embodiment of the present disclosure will be specifically explained with reference to the drawings. The overcurrent protection device of the present disclosure is well suited for such an apparatus as described below. The apparatus, for example, generates DC power from the power obtained from a commercial power supply, and using this DC power, drives a component. This component is a motor, or the like, with which the current greatly varies, and a high current instantaneously flows.

Figure 1:
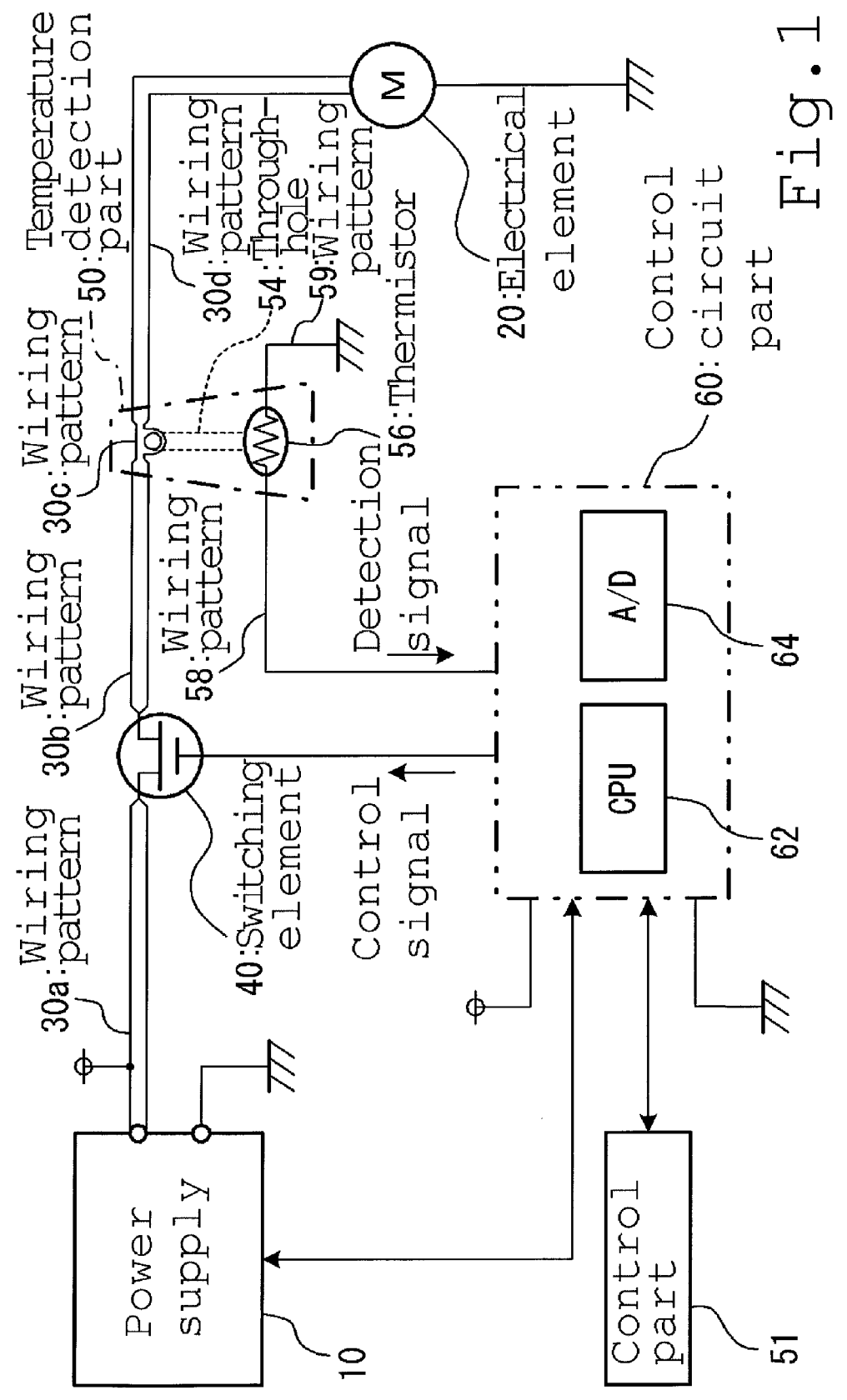

As shown in FIG. 1, the present embodiment also provides a circuit that uses DC power outputted by a power supply 10 to drive an electrical element 20, which is a load, such as a motor. However, between the power supply 10 and the electrical element 20, there are connected wiring patterns 30a and 30b (a first wiring circuit), a wiring pattern 30c (a heat generation wiring part), and a wiring pattern 30d (a first wiring circuit). These wiring patterns 30a, 30b, 30c, and 30d presuppose that a relatively high current is caused to flow. Therefore, in the circuit diagram in FIG. 1, these wiring patterns are represented with a line having a large width for convenience.

Between the wiring pattern 30a and the wiring pattern 30b, there is connected a switching element 40 (a connection/disconnection part). This switching element 40 turns on/off the power to be supplied to the electrical element 20, or controls the voltage to be applied to the electrical element 20. The voltage to be applied to the electrical element 20 may be controlled with a control signal, such as a PWM (Pulse Width Modulation) wave signal.

The wiring pattern 30c sandwiched between the wiring pattern 30b and the wiring pattern 30d is one of the components of the temperature detection part 50. Besides this, the temperature detection part 50 is comprised of a through-hole (also called a via) 54 (a penetration member), a thermistor 56 (a temperature detection member), wiring patterns 58 and 59 (a second wiring circuit), and the like.

The thermistor 56 constituting the temperature detection part 50 is connected to a control circuit part 60 (a control part) through the wiring pattern 58. The control circuit part 60 has a CPU 62 and an A/D 64 (Analog-to-Digital converter). The CPU 62 is used for comparison operation. The A/D 64 converts an analog detection signal sent from the thermistor 56 through the wiring pattern 58 into a digital detection signal. The control circuit part 60 normally delivers a control signal to the switching element 40 for controlling the voltage to be applied to the electrical element 20. Besides this, in the case where it has been detected that an overcurrent is flowing in the electrical element 20, the control circuit part 60 uses the switching element 40 to turn off the power to be supplied to the electrical element 20.

In addition, a control part 51 connected to the control circuit part 60 is comprised of a speaker or a display having a touch panel, as an example. The control part 51 issues a variety of operation commands to the control circuit part 60. Besides this, the control circuit part 60 can cause the control part 51 to display a piece of information using a character, picture, or the like, or generate a voice, or the like, to attract an attention.

Next, the configuration of the temperature detection part 50 will be explained with the use of FIG. 2. In FIG. 2A, FIG. 2B and FIG. 2C, the area hatched with right inclined lines shows a wiring board 70 (an insulating member). In the present disclosure, the wiring board 70 may be made of any material, provided that it is an insulator. For convenience, the face shown in FIG. 2A is referred to as a face A, while the face shown in FIG. 2B being referred to as a face B. In addition, FIG. 2C is a sectional view taken in the direction of the arrows of the line X-X' in FIG. 2A or FIG. 2B.

Figure 2B:
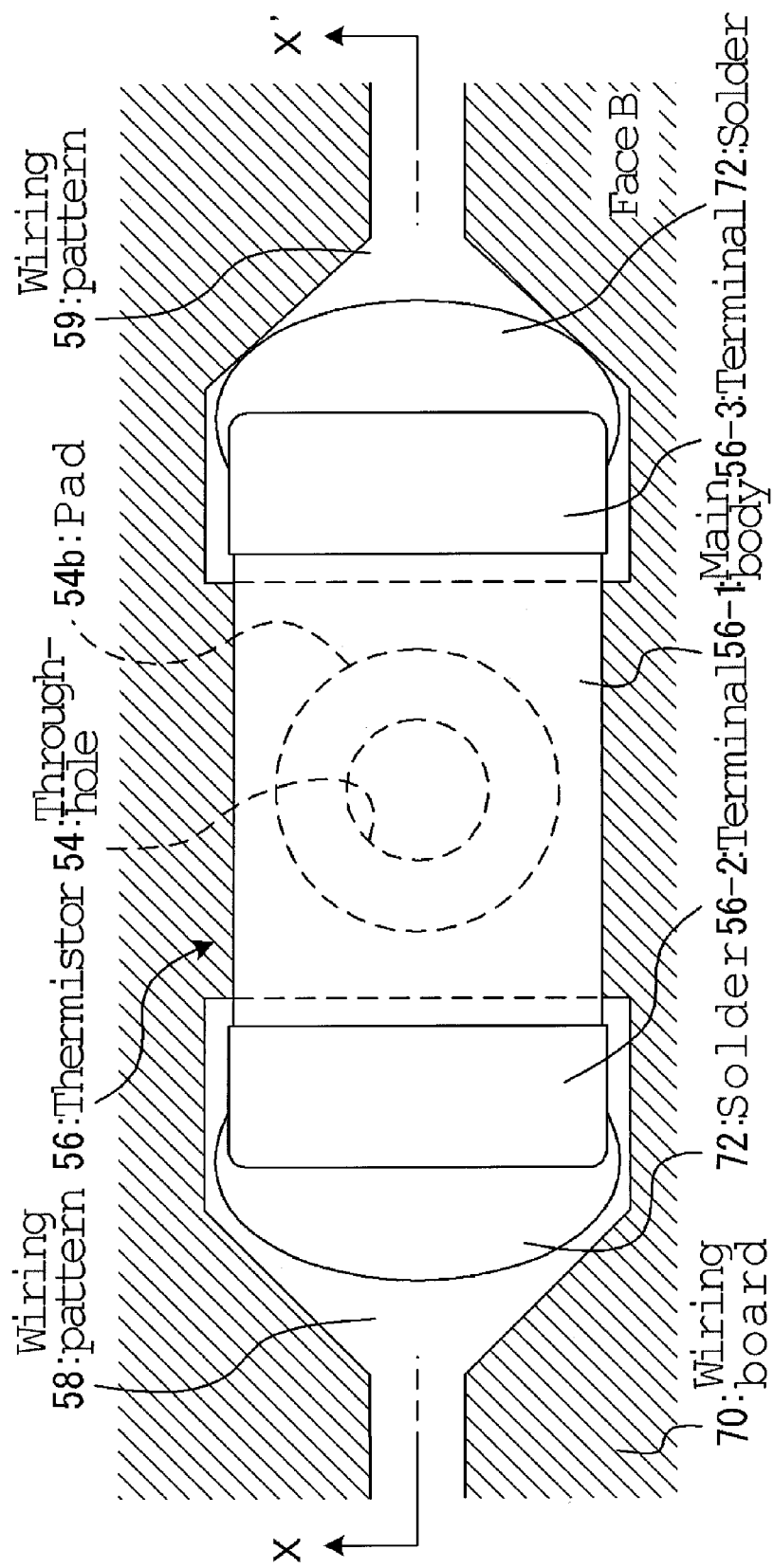
FIG. 2B is plan views of another face of a circuit board of the first embodiment of the present disclosure that is related to an image forming apparatus.
Figure 2C:
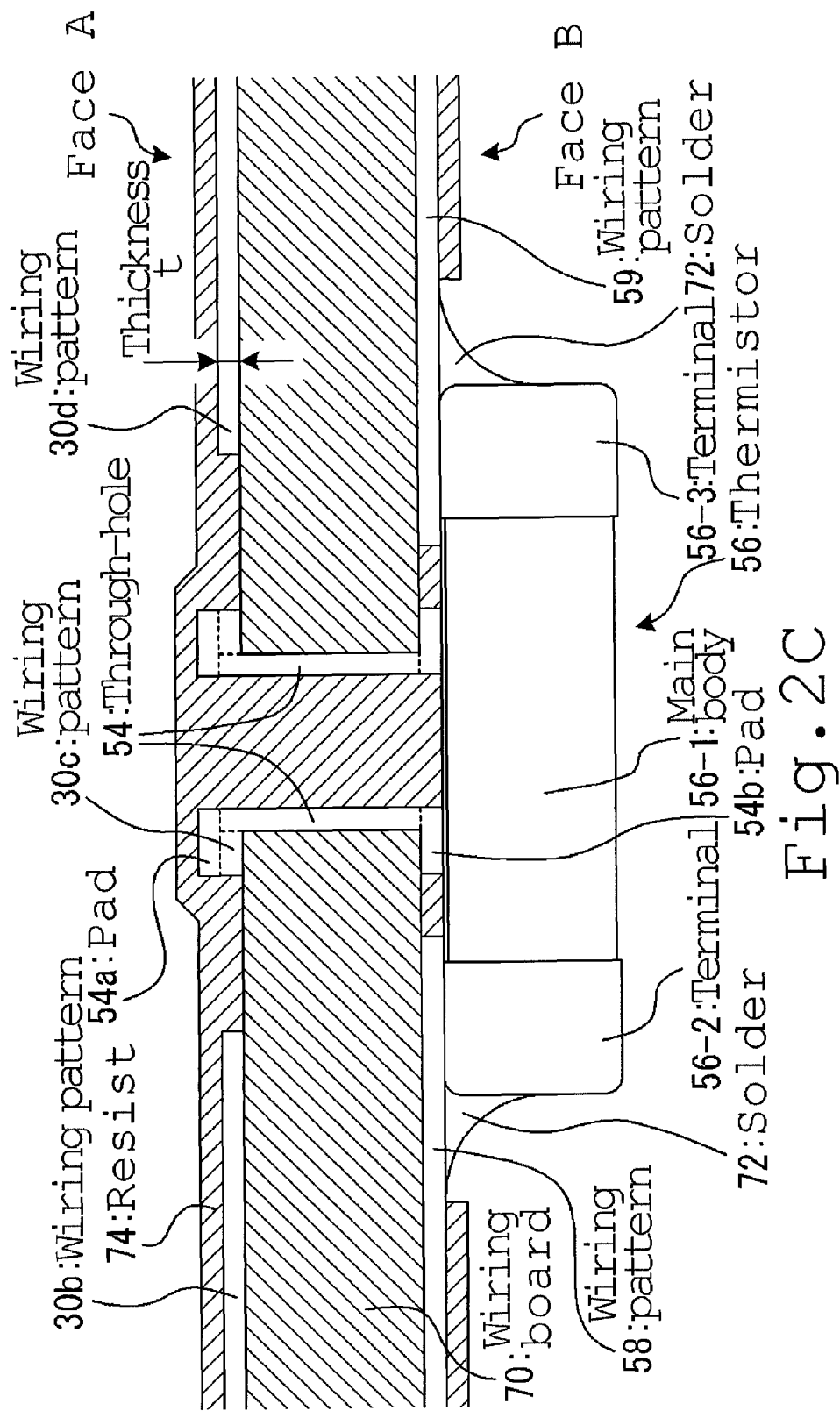
FIG. 2C is a sectional view of the same circuit board.

In FIG. 2A, FIG. 2B, and FIG. 2C, the wiring patterns 30b to 30d and the wiring patterns 58 and 59 are formed of a copper foil, or the like, on the surfaces of the wiring board 70 (on the face A and the face B, respectively). The thickness t is 16 μm, as an example.

The wiring pattern 30b and the wiring pattern 30c are continued with each other. In addition, the wiring pattern 30c is also continued with the wiring pattern 30d.

The width w1 of the wiring pattern 30b and the width w3 of the wiring pattern 30d are equal to each other, as an example. The width w1 and the width w3 are widths that render the temperature rise due to a current I flowing in the wiring pattern 30b or the wiring pattern 30d negligible, respectively.

On the other hand, the width w2 of the wiring pattern 30c is made narrower than the width w1 or width w3 in order to cause heat to be generated by the current I. This width w2 will be later described in detail.

In the vicinity of the wiring pattern 30c, a through-hole 54 is formed. The through-hole 54 is made of the same material as that of, and has the same thickness as that of the wiring patterns 30b to 30d, 58, and 59, as an example. In addition, the through-hole 54 has an inside diameter d of 0.8 mm, as one example, being formed so as to penetrate from the face A to the face B of the wiring board 70.

At a face-A end of this through-hole 54, a pad (also referred to as a land) 54a is integrally formed, while, at a face-B end, a pad 54b is integrally formed. The pads 54a and 54b are also made of the same material as that of, and have the same thickness as that of the wiring patterns 30b to 30d, 58, and 59, as one example.

With this pad 54a, apart of the outer edge thereof is continued with the wiring pattern 30c. However, the pad 54b is formed so as to separate between the wiring pattern 58 and the wiring pattern 59. Further, the outermost surface of the face A and that of the face B of the wiring board 70 shown in FIG. 2A to FIG. 2C are coated with a resist 74, which is indicated with left inclined hatching lines in FIG. 2C. The areas in which this resist 74 is coated exclude such a portion as that where a part, such as the thermistor 56, is mounted, and welded with a solder 72. This resist 74 prevents the respective wiring patterns and the pad from being corroded, and a solder from adhering.

Essentially, on the face B of the wiring board 70 shown in FIG. 2B, the thermistor 56 is mounted so as to cover the through-hole 54. Therefore, the through-hole 54 and the pad 54b cannot be directly inspected visually.

The thermistor 56 is mounted to the face B of the wiring board 70. In other words, the terminal 56-2 formed in one end part of the thermistor 56 is fixed to the wiring pattern 58 with the solder 72. Further, the terminal 56-3 formed in the other end part of the thermistor 56 is fixed to the wiring pattern 59 with the solder 72. In this case, one face of a main body 56-1 of the thermistor 56 that is opposed to the wiring board 70 is disposed in proximity of or in abutment against the pad 54b formed integrally with the through-hole 54.

In the present embodiment, the through-hole 54 is made of copper, thereby being capable of extremely easily transmit heat. On the other hand, the material, such as glass epoxy resin or paper phenol resin, that is generally used for the wiring board 70 cannot easily transmit heat.

The material used for the wiring board 70 has a thermal conductivity of 0.1 to 0.3 W/(m·K) or so, while copper has a thermal conductivity of approx. 398 W/(m·K). Therefore, in the present embodiment, the heat generated by the wiring pattern 30c is efficiently transmitted to the main body 56-1 of the thermistor 56 through the pad 54a, the through-hole 54, and the pad 54b.

In other words, by using the through-hole 54, the thermistor 56 disposed on the face B of the wiring board 70 can highly accurately detect the temperature of the heat that has been generated by the wiring pattern 30c on the face A of the wiring board 70.

When a current flows from the wiring pattern 30b to the wiring pattern 30d, the wiring pattern 30c generates heat. FIG. 3 gives a relationship between the raised temperature (° C.) and the current I for typical values of the width w2 of this wiring pattern 30c. The relationship given in FIG. 3 is that in the case where the ambient temperature is 25° C.

As can be seen from FIG. 3, with the wiring pattern 30c, if the current I is increased, the amount of heat generated is increased, thereby the amount of temperature rise being increased.

In the present embodiment, on the basis of the values given in FIG. 3, it is temporarily specified that the current I flowing in a steady state is 1.4 A or under, while the current I flowing upon an overcurrent is 3 A or above. In this case, by setting the width w2 at 0.5 mm, an overcurrent can be detected with the thermistor 56.

In other words, the temperature rise of the wiring pattern 30c should essentially be 10° C. with respect to the ambient temperature. However, when the temperature rise has reached 45° C., it can obviously be determined that an overcurrent flows, and therefore the value of temperature rise of 45° C. is specified as the threshold value.

Figure 4:
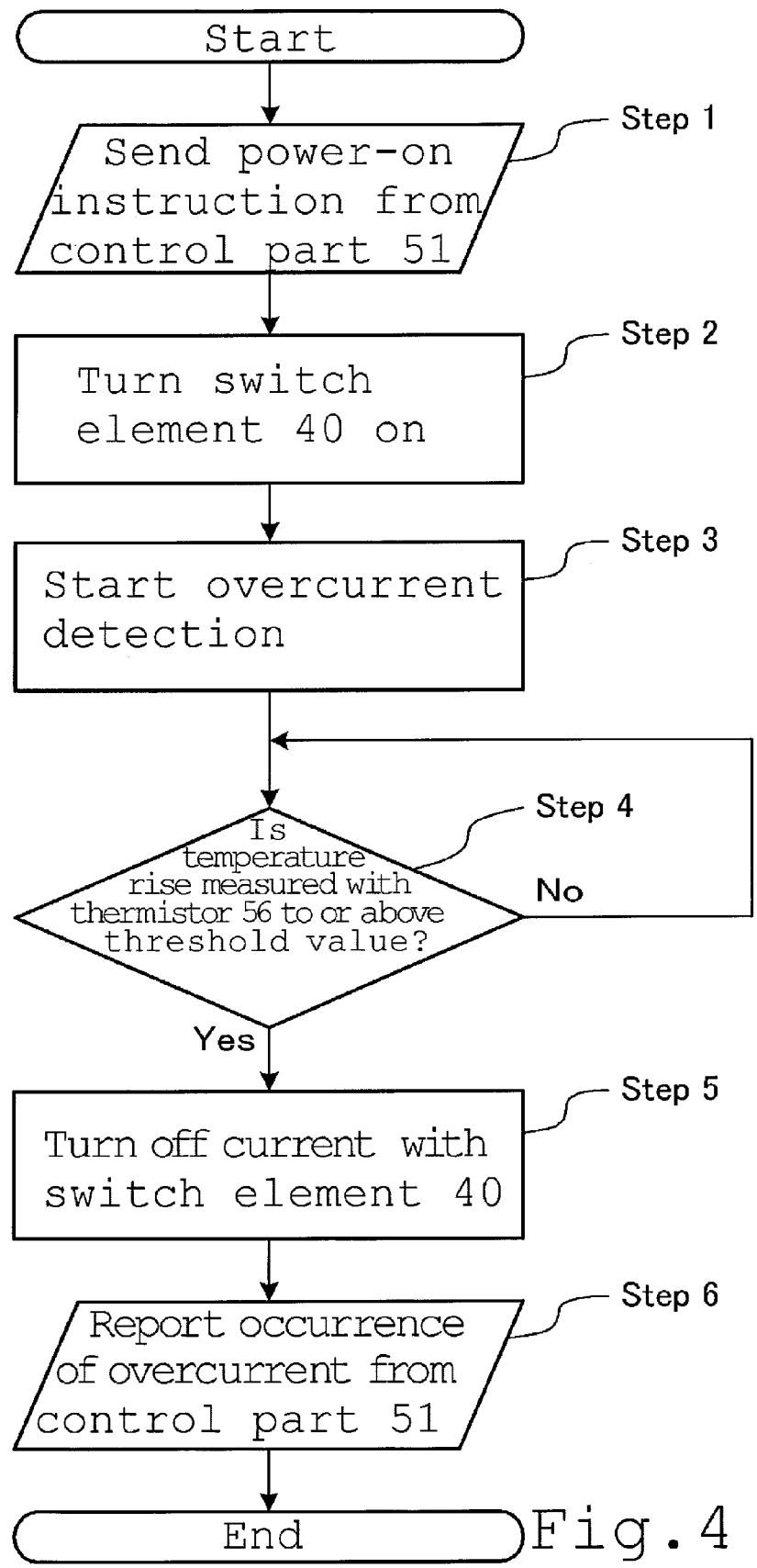
FIG. 4 is a flowchart illustrating one example of flow of the operation steps in the first embodiment of the present disclosure.

Next, the steps for protection against an overcurrent in the present embodiment will be explained with the use of FIG. 4. In the present embodiment, as Step 1, an instruction for turning power on is sent from the control part 51 to the control circuit part 60.

In response to this, in Step 2, the control circuit part 60 outputs a control signal to the switching element 40, thereby the switching element 40 being turned on.

Then, the current I starts to flow from the power supply 10 to the electrical element 20 through the wiring pattern 30a, the switching element 40, the wiring pattern 30b, the wiring pattern 30c, and the wiring pattern 30d, and as Step 3, the control circuit part 60 starts overcurrent detection. Step 3 is a step in which the control circuit part 60 sets a value of, for example, 45° C. for the CPU 62 as the threshold value of temperature rise to determine the occurrence of an overcurrent.

Next, in Step 4, the control circuit part 60 takes in a signal for the temperature measured with the thermistor 56 from the A/D 64 to calculate a value of temperature rise by means of the CPU 62 for comparing the value of temperature rise with the threshold value. In this Step 4, if it has been determined that the value of temperature rise is equal to or above the threshold value, the control circuit part 60 interrupts the control signal for the switching element 40 to turn off the current I as Step 5. As Step 6, the control circuit part 60 reports the occurrence of an overcurrent from the control part 51 with a character or a sound, thereby terminating the flow of steps.

Step 4 is a step in which, in order to determine the occurrence of an overcurrent, the temperature rise of the wiring pattern 30c is monitored. In the case where the value of temperature rise is under the threshold value, the temperature rise of the wiring pattern 30c is repetitively monitored in Step 4.

Second Embodiment

With the above-described configuration in the first embodiment, the wiring pattern 30c, which is narrower in width, is formed on the circuit board in which a current flows, and using this wiring pattern 30c as a source of generated heat, the occurrence of an overcurrent has been monitored. However, a configuration that directly monitors heat generation of an electrical element, such as a semiconductor element, may be provided.

Figure 5A:
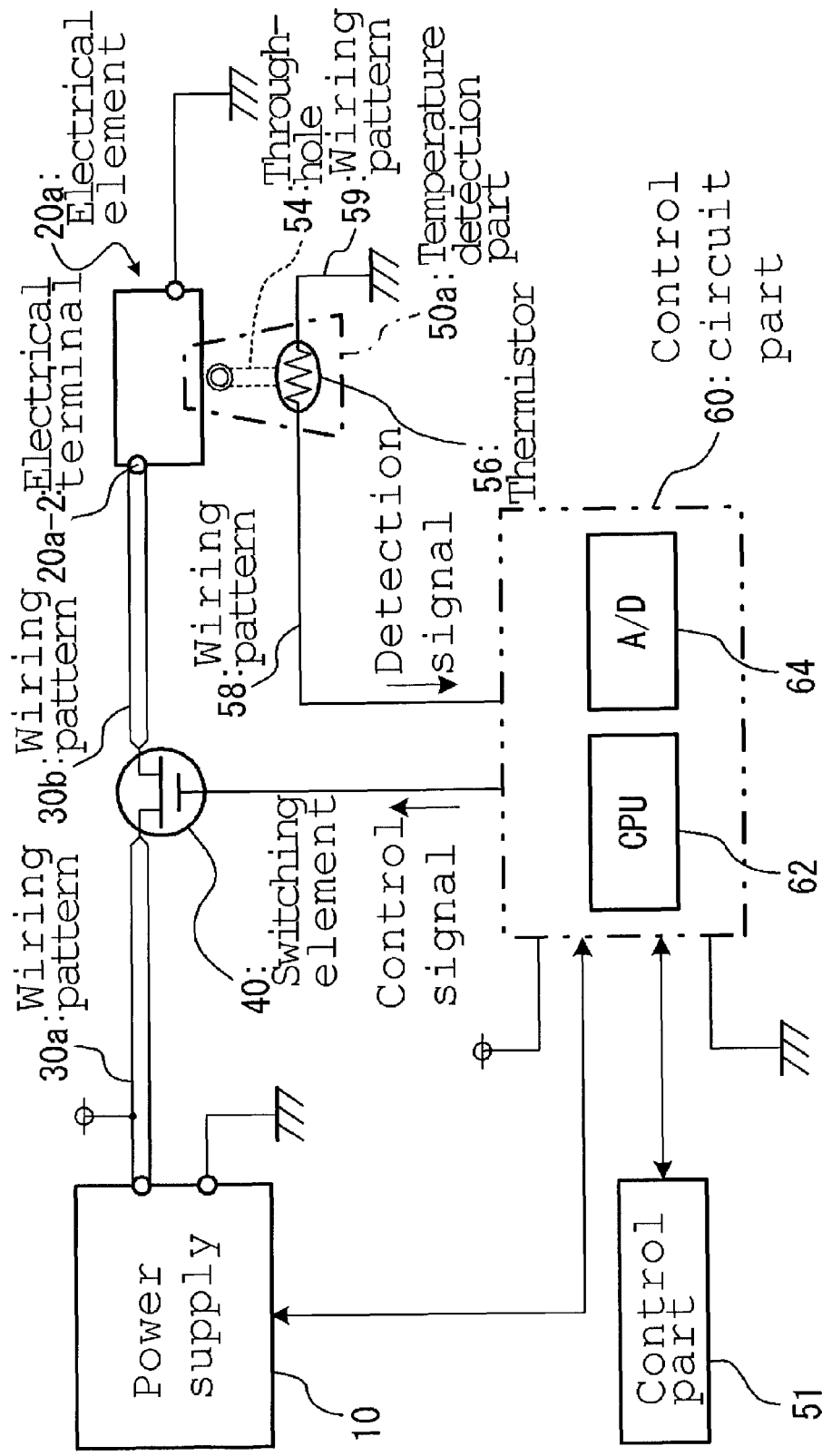
FIG. 5A is a block diagram illustrating a configuration of an overcurrent protection device of a second embodiment of the present disclosure that is related to an image forming apparatus.
Figure 5B:
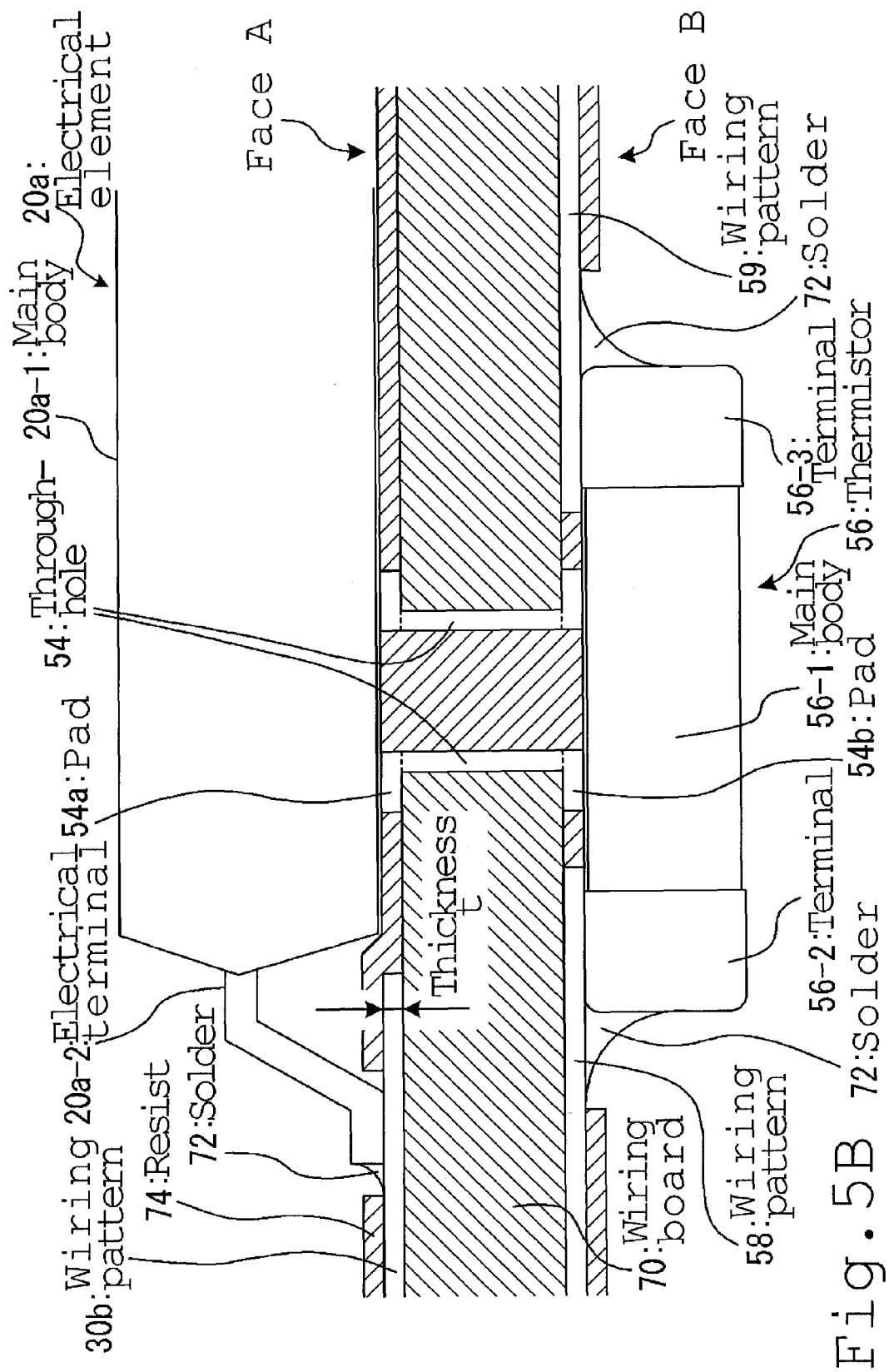
FIG. 5B is a sectional view of a circuit board of the same overcurrent protection device in FIG. 5A.

Hereinbelow, an example of configuration that monitors heat generation of an electrical element to thereby protect against an overcurrent will be explained with the use of FIG. 5A and FIG. 5B. In FIG. 5A and FIG. 5B, the components corresponding to those shown in FIG. 1 or FIG. 2A to FIG.

2C will be provided with the same symbols, and the detailed explanation thereof will be omitted.

In FIG. 5A, DC power outputted by a power supply 10 is supplied to an electrical element 20a through a wiring pattern 30a, a switching element 40, a wiring pattern 30b, and an electric terminal 20a-2. This electrical element 20a is a CPU with which, at the time of high-speed processing, a high current flows, thereby heat being generated, or a driver element that generates heat in controlling the current to be supplied to a load.

The temperature detection part 50a is comprised of a through-hole 54, a thermistor 56, wiring patterns 58 and 59, and the like.

Next, referring to FIG. 5B, the electrical element 20a is a structure that is molded with resin, or the like. In addition, an electric terminal 20a-2 that is protruded from a main body 20a-1 of the electrical element 20a is fixed to the top face of the wiring pattern 30b with a solder 72. In addition, in this example, the through-hole 54 is formed in a location where it is opposed to the bottom face of the main body 20a-1 of the electrical element 20a.

Thereby, one face of the main body 20a-1 of the electrical element 20a that is opposed to the wiring board 70 is disposed in proximity of or in abutment against the pad 54a formed integrally with the through-hole 54.

Therefore, the thermistor 56 disposed on the face B of the wiring board 70 can highly accurately detect the temperature of the heat that has been generated by the electrical element 20a on the face-A side of the wiring board 70.

The pad 54a that is formed integrally with the through-hole 54 is not required to be connected with any other component, such as a wiring pattern. In addition, the electrical element 20a is not limited to that which is molded with resin, and may be that which is sealed in a ceramic container, or that which has a metallic electrode (terminal) in the main body part.

According to the configuration shown in FIG. 5A and FIG. 5B, there is no need for providing a narrower width portion for the wiring pattern between the power supply and the electrical element, which is a load. Therefore, this configuration can contribute to downsizing of the wiring board.

Third Embodiment

Further, another example of configuration will be explained with the use of FIG. 6A and FIG. 6B. Also in this example of configuration, heat generation of an electrical element is monitored to thereby protect against an overcurrent. Also in FIG. 6A and FIG. 6B, the components corresponding to those shown in FIG. 1 or FIG. 2A to FIG. 2C, FIG. 5A, or FIG. 5B will be provided with the same symbols, and the detailed explanation thereof will be omitted.

Figure 6A:
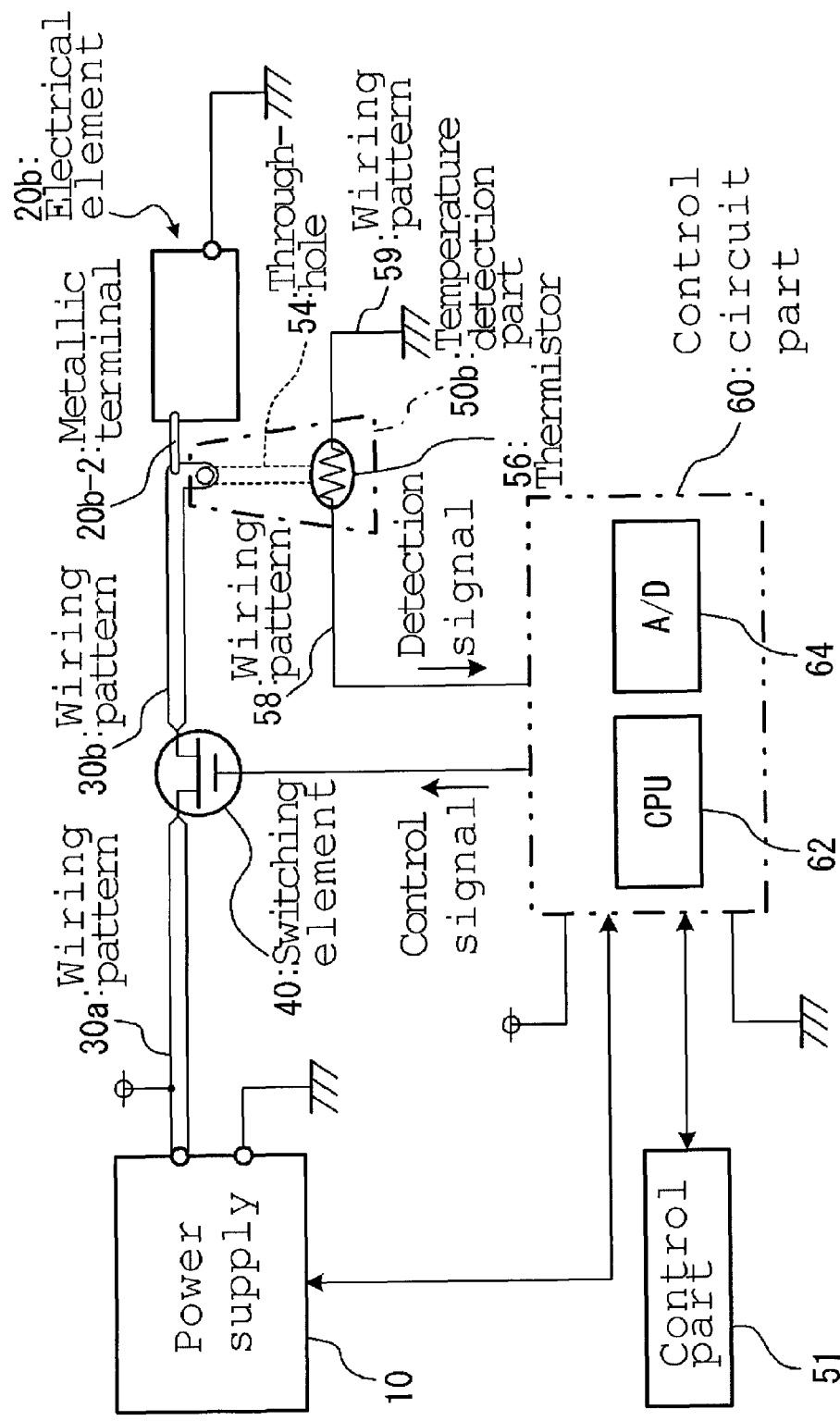
FIG. 6A is a block diagram illustrating a configuration of an overcurrent protection device of a third embodiment of the present disclosure that is related to an image forming apparatus.

In FIG. 6A, DC power outputted by a power supply 10 is supplied to an electrical element 20b through a wiring pattern 30a, a switching element 40, a wiring pattern 30b, and a metallic terminal 20b-2. This electrical element 20b is also a CPU or a driver element. With the CPU, a high current flows at the time of high-speed processing, thereby heat being generated. The driver element generates heat in controlling the current to be supplied to a load.

The temperature detection part 50b is comprised of a through-hole 54, a thermistor 56, wiring patterns 58 and 59, and the like.

Next, referring to FIG. 6B, the electrical element 20b is also a structure that is molded with resin, or the like. In addition, an electric terminal 20b-2 that is protruded from a main body 20b-1 of the electrical element 20b is fixed to the top face of the wiring pattern 30b with a solder 72.

The through-hole 54 is formed in the vicinity of a portion where the metallic terminal 20b-2 is fixed in the wiring pattern 30b. In addition, a pad 54a that is formed integrally with a face-A end of the through-hole 54 is formed integrally with the wiring pattern 30b.

With the configuration shown in FIG. 6B, the top face of the pad 54a that is formed on the face A of the wiring board 70 is also coated with a resist 74, which is indicated with left inclined hatching lines. In addition, the electrical element 20b has a shape that causes the main body 20b-1 to be mounted, being separated from the wiring board 70 and the resist 74. Therefore, heat cannot be easily transmitted from the electrical element 20b to the through-hole 54.

However, the metallic terminal 20b-2 is formed of a metal having a high thermal conductivity, such as copper. In addition, the through-hole 54 is formed integrally with the wiring pattern 30b that is in the vicinity of the metallic terminal 20b-2. Therefore, the heat of the main body 20b-1 is easily transmitted to the through-hole 54 through the metallic terminal 20b-2 and the wiring pattern 30b.

Therefore, the thermistor 56 that is disposed on the face B of the wiring board 70 can highly accurately detect the temperature of the heat that has been generated by the electrical element 20b on the face-A side of the wiring board 70.

Thus, according to the above-described respective embodiments, the heat generated by a current is transmitted to the thermistor with a through-hole having a high thermal conductivity. Then, on the basis of a signal outputted by the thermistor, an increase in current is highly efficiently detected. Therefore, in the case where it has been determined that there has occurred an overcurrent, the current can be turned off before the element or pattern, which is a source of generated heat, being damaged.

In addition, the thermistor used in the above-described respective embodiments need not be replaced with a new one after the overcurrent having been cut off as with an overcurrent protection element, such as a fuse. In other words, the thermistor is different from a component having no returnability, such as a fuse.

Hereinbelow, on the basis of the above description of the first-to-third embodiments, the advantages of the present invention will be discussed in comparison with prior art techniques. For example, with a typical prior art technique, the temperature of a component part is monitored by detecting the temperature of a wiring pattern to which the heat generated by the component part is transmitted. However, such a technique presupposes that it is applied to a wiring pattern with a large width, such as a high-voltage wiring pattern. Thus, in the case where the wiring pattern width is narrow or the wiring pattern geometry is complicated, the thermal resistance becomes high, thereby the heat generated being not easily transmitted, and therefore the temperature could not have been detected with good accuracy.

In addition, with another typical prior art technique, by providing a thermistor on a portion of the substrate material that has no wiring pattern, the temperature of a wiring pattern surrounding the thermistor is detected. However, the thermal conductivity of a circuit board material is generally extremely low (for example, as low as $1/2000$), when compared with the thermal conductivity of the material for a wiring pattern. Therefore, even if a thermistor is provided on a portion where there is no wiring pattern, the heat generated will practically be not transmitted to the thermistor. Therefore, the accuracy of temperature detection has been low.

There is available another technique that can inexpensively and satisfactorily detect the temperature, however, the technique has not been that which can protect against an overcurrent.

Contrarily to this, in accordance with the present disclosure, by only forming a place where heat is generated upon the occurrence of an overcurrent, the temperature substantially equal to that at the place can be detected, the need for adding a complicated component or occupying a large space being eliminated. Thus, an overcurrent protection device that can satisfactorily detect an overcurrent can be proposed.

In other words, in accordance with the present disclosure, there is provided an advantage that detection of an overcurrent can be implemented with space saved so as not to restrict the degree of freedom in wiring layout. Further, the temperature of the heat generation place can be detected with good accuracy. Therefore, an overcurrent can be detected to turn off the current before the element or pattern, which is a source of generated heat, being damaged. Further, unlike a component having no returnability, such as a fuse, the thermistor need not be replaced with a new one after the overcurrent having been cut off.

In the above-described respective embodiments, there has been given an example in which, for the through-hole, the same material as that for the respective wiring patterns and pads is used, however, another material, for example, silver may be used for the through-hole. Silver has a thermal conductivity as high as 420 W/(m·K), for example. In other words, silver can transmit heat better than copper.

Further, the number, location, geometry, and the like, of the above-mentioned component members are not limited to those stated in the above-described embodiments. In other words, in implementing the present disclosure, the number, location, geometry, and the like, may be adapted to suitable ones. Further, in the respective figures, the same components are provided with the same symbols.

What is claimed is:
1. An overcurrent protection device, comprising:
an insulating member, allowing formation of a first wiring circuit passing a current on a first face thereof, and formation of a second wiring circuit on a second face thereof, said second face being a face opposite to said first face;
a penetration member, penetrating through said insulating member, thereby being capable of transmitting heat from said first face to said second face;
a heat generation wiring part, being formed in continuation with one end part of said penetration member in a portion of said first wiring circuit and generating heat with said current being passed;
a connection/disconnection part, being inserted into said first wiring circuit to turn on or off said current;
a temperature detection member, being disposed in proximity of or in abutment against the other end part of said penetration member on said second face to detect heat transmitted from said heat generation wiring part by the penetration member and output a temperature detection signal for said heat generation wiring part; and
a control part, controlling said connection/disconnection part on the basis of said detection signal,
said heat generation wiring part being narrower than a first line width, said first line width not allowing the temperature to be raised to a prescribed threshold value or thereabove with said current flowing in a steady state, and having a second line width, said second line width allowing the temperature to be raised to or above said prescribed threshold value upon the current becoming an overcurrent, being sandwiched between wiring patterns having said first line width, and
upon the temperature of said heat generation wiring part detected by said temperature detection member having been raised to or above said prescribed threshold value, said control part determining said current to have become an overcurrent, thereby controlling said connection/disconnection part to turn off said current.

* * * * *